United States Patent
Lim et al.

(10) Patent No.: US 9,887,199 B2
(45) Date of Patent: Feb. 6, 2018

(54) SEMICONDUCTOR DEVICES INCLUDING A PERIPHERAL CIRCUIT REGION AND FIRST AND SECOND MEMORY REGIONS, AND RELATED PROGRAMMING METHODS

(71) Applicants: Joon-Sung Lim, Yongin-si (KR); Jang-Gn Yun, Hwaseong-si (KR); Hoosung Cho, Yongin-si (KR)

(72) Inventors: Joon-Sung Lim, Yongin-si (KR); Jang-Gn Yun, Hwaseong-si (KR); Hoosung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/670,667

(22) Filed: Mar. 27, 2015

(65) Prior Publication Data

US 2015/0340366 A1    Nov. 26, 2015

(30) Foreign Application Priority Data

May 21, 2014    (KR) .................. 10-2014-0061018

(51) Int. Cl.
| | | |
|---|---|---|
| *H01L 27/088* | (2006.01) | |
| *H01L 27/105* | (2006.01) | |
| *H01L 27/06* | (2006.01) | |
| *H01L 27/11524* | (2017.01) | |
| *H01L 27/11582* | (2017.01) | |
| *G11C 5/02* | (2006.01) | |
| *G11C 11/56* | (2006.01) | |
| *G11C 16/04* | (2006.01) | |
| *G11C 16/10* | (2006.01) | |

(52) U.S. Cl.
CPC ............ *H01L 27/105* (2013.01); *G11C 5/025* (2013.01); *G11C 11/56* (2013.01); *G11C 11/5628* (2013.01); *G11C 16/0483* (2013.01); *G11C 16/10* (2013.01); *H01L 27/0688* (2013.01); *H01L 27/11524* (2013.01); *H01L 27/11582* (2013.01); *G11C 2211/5641* (2013.01)

(58) Field of Classification Search
CPC ......... H01L 27/10894; H01L 27/10814; H01L 27/10855; H01L 27/10897; H01L 27/10885; H01L 27/1116; H01L 27/11; H01L 27/0688; H01L 27/11582; H01L 21/8221; G11C 5/02; G11C 16/0483
See application file for complete search history.

(56) References Cited

U.S. PATENT DOCUMENTS

| | | |
|---|---|---|
| 6,351,406 B1 | 2/2002 | Johnson et al. |
| 8,139,406 B2 | 3/2012 | Park et al. |
| 8,236,650 B2 | 8/2012 | Son et al. |
| 8,270,214 B2 | 9/2012 | Shibata et al. |
| 8,355,281 B2 | 1/2013 | Grossi et al. |

(Continued)

FOREIGN PATENT DOCUMENTS

| | | |
|---|---|---|
| KR | 10-2011-0101642 A | 9/2011 |
| KR | 10-2012-0049734 A | 5/2012 |

*Primary Examiner* — Khiem D Nguyen
(74) *Attorney, Agent, or Firm* — Myers Bigel, P.A.

(57) ABSTRACT

Semiconductor devices are provided. A semiconductor device includes a peripheral circuit region and a first memory region that are side by side on a substrate. Moreover, the semiconductor device includes a second memory region that is on the peripheral circuit region and the first memory region. Related methods of programming semiconductor devices are also provided.

10 Claims, 13 Drawing Sheets

(56) References Cited

U.S. PATENT DOCUMENTS

| | | |
|---|---|---|
| 8,455,941 B2 | 6/2013 | Ishihara et al. |
| 8,507,976 B2 | 8/2013 | Joo et al. |
| 8,530,955 B2 | 9/2013 | Iino et al. |
| 8,705,274 B2 | 4/2014 | Liu et al. |
| 2009/0121271 A1* | 5/2009 | Son .................. H01L 21/8221 257/315 |
| 2009/0168482 A1* | 7/2009 | Park .................... G11C 5/02 365/51 |
| 2011/0007571 A1* | 1/2011 | Park .................. G11C 11/5628 365/185.22 |
| 2011/0019480 A1* | 1/2011 | Kito ................ H01L 27/11565 365/185.18 |
| 2011/0121403 A1* | 5/2011 | Lee ................ H01L 27/11526 257/390 |
| 2011/0284817 A1* | 11/2011 | Sasago .............. H01L 27/1021 257/5 |
| 2012/0327711 A1 | 12/2012 | Shim et al. |
| 2013/0130468 A1 | 5/2013 | Higashitani et al. |
| 2013/0258796 A1 | 10/2013 | Hioka et al. |
| 2014/0085979 A1* | 3/2014 | Kono .................. G11C 16/06 365/185.11 |

* cited by examiner

SEMICONDUCTOR DEVICES INCLUDING A PERIPHERAL CIRCUIT REGION AND FIRST AND SECOND MEMORY REGIONS, AND RELATED PROGRAMMING METHODS

CROSS-REFERENCE TO RELATED APPLICATION

This U.S. non-provisional patent application claims priority under 35 U.S.C. § 119 to Korean Patent Application No. 10-2014-0061018, filed on May 21, 2014, in the Korean Intellectual Property Office, the disclosure of which is hereby incorporated herein by reference in its entirety.

BACKGROUND

The present disclosure relates to semiconductor devices and methods of programming the same. A three-dimensional integrated circuit (3D-IC) memory technique has been developed to increase a memory capacity of a semiconductor memory device. The 3D-IC memory technique includes a variety of methods for arranging memory cells three-dimensionally. In addition to the 3D-IC memory technique, a patterning technique for fine patterns and a multi-level cell (MLC) technique may be used to increase the memory capacity of the semiconductor memory device. However, the patterning technique for the fine patterns may be relatively expensive, and the MLC technique may not be suitable to increase the number of bits per a unit cell. Thus, the 3D-IC memory technique may help to increase the memory capacity. In addition, if the patterning technique for the fine patterns and the MLC technique are combined with the 3D-IC memory technique, then the memory capacity may be further increased. Also, the patterning technique for the fine patterns and the MLC technique may be developed independently of the 3D-IC memory technique.

SUMMARY

Various embodiments of present inventive concepts may provide semiconductor devices capable of improving an integration degree. Moreover, various embodiments of present inventive concepts may provide methods of programming a semiconductor memory device capable of reducing a coupling effect. For example, according to various embodiments of present inventive concepts, a semiconductor device may include: a peripheral circuit part and a first memory part side by side on a substrate; and a second memory part on the peripheral circuit part and the first memory part. In some embodiments, the second memory part may include: a semiconductor layer on the peripheral circuit part and the first memory part; active pillars protruding from the semiconductor layer; word lines adjacent sidewalls of the active pillars; and bit lines on the active pillars. In some embodiments, the first memory part may include: a gate electrode on the substrate; and a tunnel dielectric layer, a data storage element, and a blocking dielectric layer sequentially stacked between the substrate and the gate electrode.

In various embodiments, the first memory part may be configured to be used as a buffer memory. Moreover, in some embodiments, the first memory part may have a memory structure of at least one of a static random access memory (SRAM), a dynamic random access memory (DRAM), a magnetic random access memory (MRAM), a phase change random access memory (PRAM), a ferroelectric random access memory (FRAM), a resistive random access memory (RRAM), a NOR flash memory, or a NAND flash memory.

According to various embodiments, the first memory part may be adjacent one or more sides of the peripheral circuit part on the substrate. In some embodiments, the first memory part may include first memory cells, and the second memory part may include second memory cells. A first quantity of the first memory cells may be smaller than a second quantity of the second memory cells. Moreover, in some embodiments, each of the first memory cells may be configured to store single-bit data (i.e., one-bit data), and each of the second memory cells may be configured to store multi-bit data (i.e., two-or-more-bit data).

In various embodiments, the peripheral circuit part may include a peripheral gate electrode, and the first memory part may include a cell gate electrode. A first width of the peripheral gate electrode may be wider than a second width of the cell gate electrode. In some embodiments, the first memory part and the second memory part may constitute a main memory. In some embodiments, the first memory part may have a volatile memory structure, and the second memory part may have a non-volatile memory structure.

In some embodiments, the first memory part may include: first word lines that are parallel to each other and are equidistant from a surface of the substrate, and the second memory part may include: second word lines that are parallel to each other and are at different respective distances from the surface of the substrate.

A method of programming a semiconductor device including a peripheral circuit part and a first memory part side by side on a substrate and a second memory part on the peripheral circuit part and the first memory part, according to various embodiments, may include: buffer-programming data into the first memory part; and main-programming the buffer-programmed data into the second memory part. In some embodiments, the first memory part may be buffer-programmed by a single-bit program method, and the second memory part may be main-programmed by a multi-bit program method. Moreover, in some embodiments, main-programming the buffer-programmed data into the second memory part may be performed by a reprogram method. The reprogram method may include: performing a plurality of program operations to reduce a width of a distribution of threshold voltages corresponding to data to be stored.

A semiconductor device, according to various embodiments, may include: a memory controller and a buffer memory side by side on a substrate; and a main memory on the memory controller and the buffer memory. In some embodiments, the main memory may have a cell structure of a three-dimensional NAND flash memory. In some embodiments, the buffer memory may have a memory structure of at least one of a static random access memory (SRAM), a dynamic random access memory (DRAM), a magnetic random access memory (MRAM), a phase change random access memory (PRAM), a ferroelectric random access memory (FRAM), a resistive random access memory (RRAM), a NOR flash memory, or a NAND flash memory. For example, the buffer memory may have a cell structure of a two-dimensional NAND flash memory. Moreover, in some embodiments, each of a first plurality of memory cells of the buffer memory may be configured to store one-bit data, and each of a second plurality of memory cells of the main memory may be configured to store multi-bit data.

A semiconductor device, according to various embodiments, may include a peripheral circuit region on a substrate. The semiconductor device may include a first memory region beside the peripheral circuit region on the substrate. Moreover, the semiconductor device may include a second memory region overlapping the peripheral circuit region and the first memory region, and the second memory region may include a plurality of multi-level cells. In some embodiments, the first memory region may include a first plurality of word lines including coplanar respective top surfaces, and the second memory region may include a second plurality of word lines defining a stepped structure within the second memory region.

In various embodiments, the first memory region may include a plurality of single-level cells. In some embodiments, the second memory region overlapping the peripheral circuit region and the first memory region may be a main memory area, and the first memory region underlying the main memory area may be a buffer memory area. Moreover, in some embodiments, the transistor of the peripheral circuit region may include a first width that is wider than a second width of each of the first plurality of word lines of the buffer memory area.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
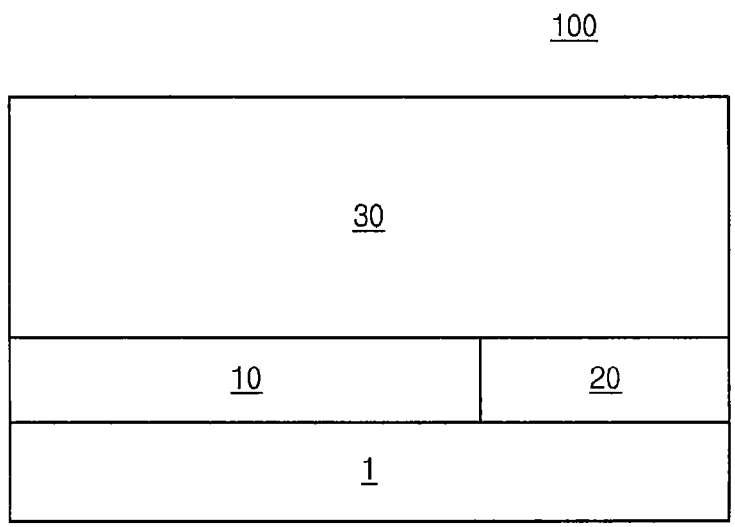
FIG. 1 is a cross-sectional block diagram illustrating an arrangement relation of inner structures of a semiconductor device according to example embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, embodiments of present inventive concepts will be described with reference to the drawings. A non-volatile memory device according to some embodiments of present inventive concepts may have a structure of a three-dimensional semiconductor device.

FIG. 1 is a cross-sectional block diagram illustrating an arrangement relation of inner structures of a semiconductor device according to example embodiments of present inventive concepts.

Referring to FIG. 1, a semiconductor device 100 according to present inventive concepts may include a peripheral circuit part 10 and a first memory part 20 that are disposed side by side on a substrate 1. A second memory part 30 is disposed on the peripheral circuit part 10 and the first memory part 20. The peripheral circuit part 10 includes peripheral circuits for driving the first memory part 20 and the second memory part 30. At least the second memory part 30 may be a user data area. Moreover, any semiconductor device "part" described herein may be referred to as a "region," a "portion," or an "area." For example, the peripheral circuit part 10 may be referred to as a peripheral circuit region, a peripheral circuit portion, or a peripheral circuit area of the semiconductor device 100.

Figure 2:
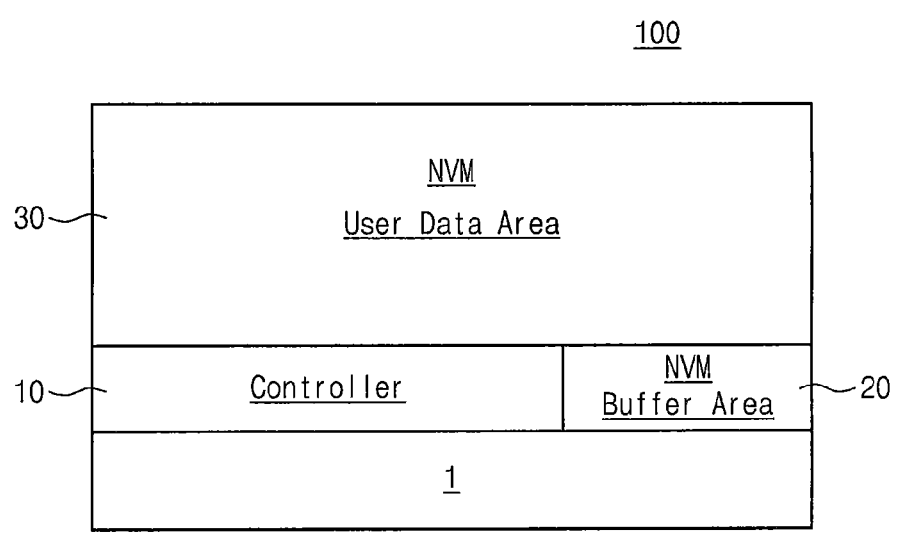
FIG. 2 is a cross-sectional block diagram illustrating an arrangement relation of inner structures of a semiconductor device according to some embodiments of present inventive concepts.
Figure 3:
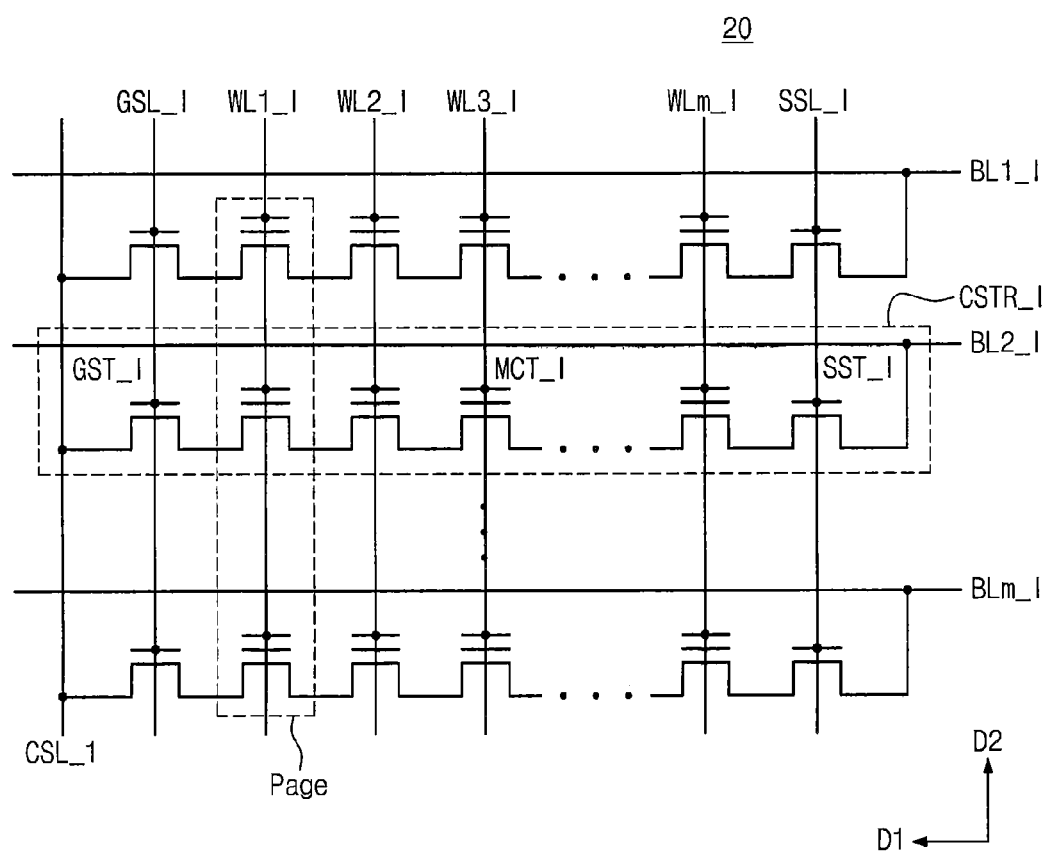
FIG. 3 is a circuit diagram of memory cells disposed in a first memory part of FIG. 2.
Figure 4:
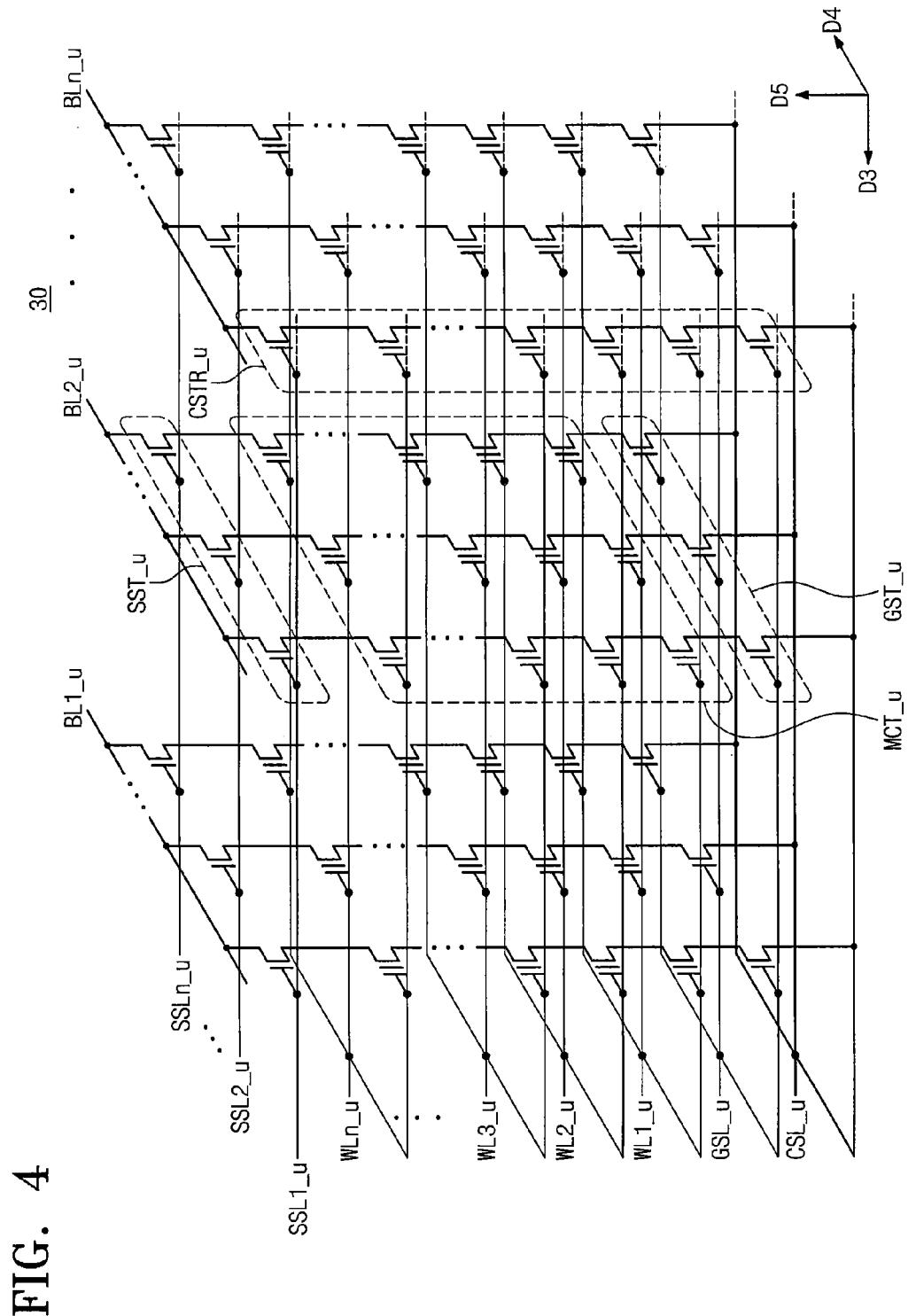
FIG. 4 is a circuit diagram of memory cells disposed in a second memory part of FIG. 2.
Figure 5:
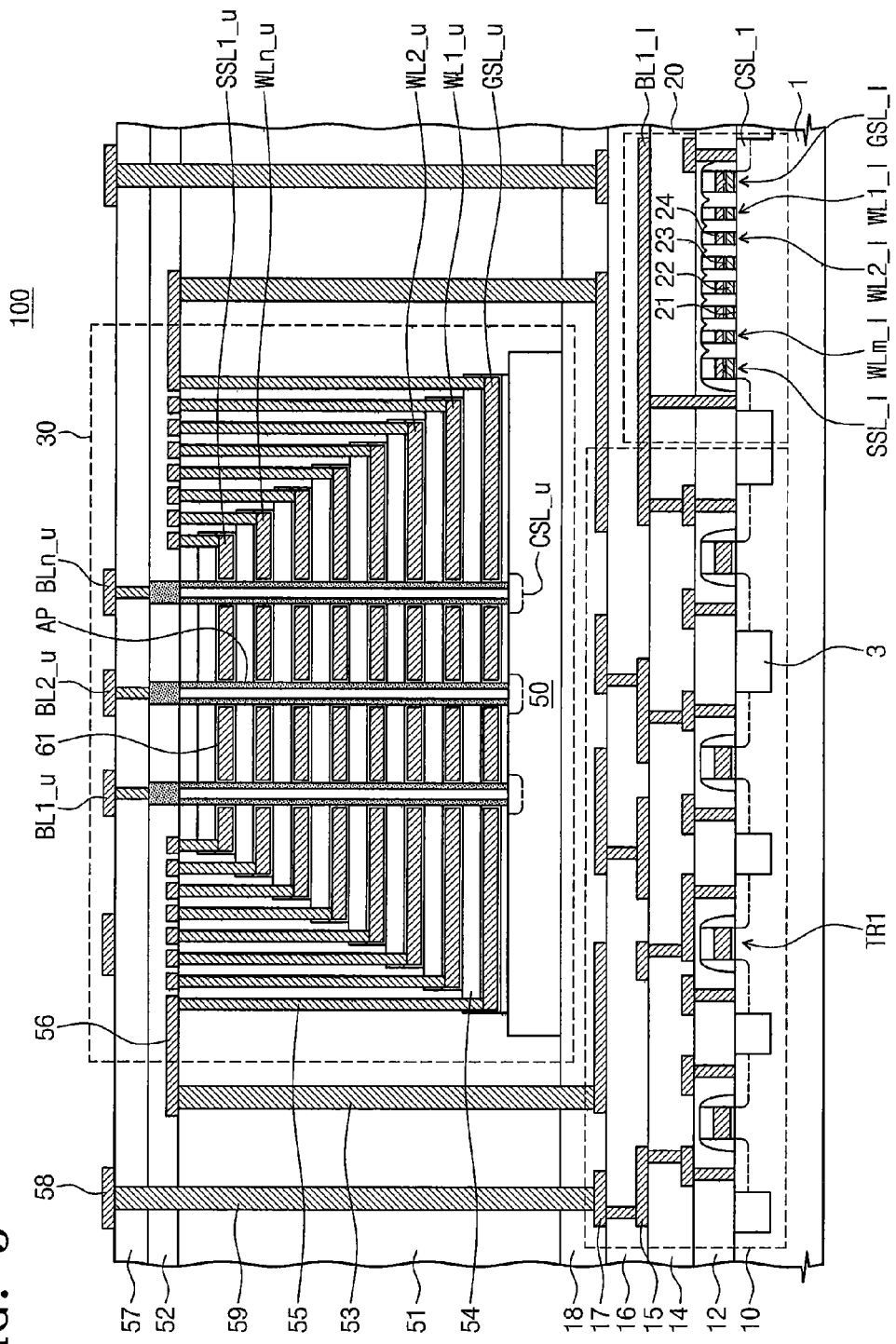
FIG. 5 is a cross-sectional view illustrating the semiconductor device of FIG. 2 according to some embodiments of present inventive concepts.

FIG. 2 is a cross-sectional block diagram illustrating an arrangement relation of inner structures of a semiconductor device according to some embodiments of present inventive concepts. FIG. 3 is a circuit diagram of memory cells disposed in a first memory part of FIG. 2. FIG. 4 is a circuit diagram of memory cells disposed in a second memory part of FIG. 2. FIG. 5 is a cross-sectional view illustrating the semiconductor device of FIG. 2 according to some embodiments of present inventive concepts.

Referring to FIG. 2, in a semiconductor device according to some embodiments, the first memory part 20 may be a buffer area of a non-volatile memory (NVM) device, and the second memory part 30 may be a user data area of the non-volatile memory device. The first memory part (i.e., the buffer area) 20 may provide a buffer memory. The second memory part (i.e., the user data area) 30 may provide a main memory. The peripheral circuit part 10 may be a memory controller.

Referring to FIGS. 2 and 5, a device isolation layer 3 may be disposed in a substrate 1 to define active regions. The peripheral circuit part 10 may include a plurality of peripheral transistors TR1 disposed on the substrate 1, lower interconnections 15, and lower pads 17. The lower interconnections 15 and the lower pads 17 may be electrically connected to the peripheral transistors TR1. The peripheral circuit part 10 and the first memory part 20 may include a plurality of lower interlayer insulating layers 12, 14, 16, and 18. For example, the plurality of lower interlayer insulating layers 12, 14, 16, and 18 may be first, second, third, and fourth insulating layers 12, 14, 16, and 18. The peripheral transistors TR1, the lower interconnections 15, and the lower pads 17 may constitute the memory controller for driving memory cells of the first memory part (or the buffer area) 20 and memory cells of the second memory part (or the user data area) 30. The memory controller (or the peripheral circuit part) 10 may include a row decoder, a page buffer, an input/output buffer, a control logic, and/or a buffer random access memory (RAM). The buffer RAM may have a volatile memory device (e.g., a dynamic random access memory (DRAM) or a static random access memory (SRAM)) or a volatile memory cell circuit structure (e.g., a memory cell circuit structure of a DRAM or a SRAM).

Referring to FIGS. 2, 3, and 5, in some embodiments, the first memory part (or the buffer area) 20 may have a two-dimensional (or planar) NAND flash memory cell structure. In more detail, the first memory part 20 may include at least one lower block. The lower block may include a plurality of lower memory cell strings CSTR_1. Each of the lower memory cell strings CSTR_1 may include a lower string selection transistor SST_1 connected to a lower string selection line SSL_1, a plurality of lower memory cell transistors MCT_1 connected to a plurality of lower word lines WL1_1 to WLm_1 (where "m" is a natural number), and a lower ground selection transistor GST_1 connected to a lower ground selection line GSL_1. Here, the lower string selection transistors SST_1 may be connected to a plurality of lower bit lines BL1_1 to BLm_1 (where "m" is a natural number), respectively, and the lower ground selection transistors GST_1 may be connected to a lower common source line CSL_1. The lower common source line CSL_1 may receive a ground voltage or a CSL voltage (e.g., a power voltage) from a CSL driver. The lower bit lines BL1_1 to BLm_1 may extend in a first direction D1. The lower string selection line SSL_1, the lower word lines WL1_1 to WLm_1, and the lower ground selection line GSL_1 may extend in a second direction D2 intersecting the first direction D1. The lower word lines WL1_1 to WLm_1 and the lower ground selection line GSL_1 may be disposed at the same height as each other on the substrate 1 (e.g., equidistant from a top surface of the substrate 1). In other words, respective top surfaces of the lower word lines WL1_1 to WLm_1 and the lower ground selection line GSL_1 may be coplanar.

The lower memory cell transistors MCT_1 connected to each of the lower word lines WL1_1 to WLm_1 may be defined as "a page". Each of the lower memory cell transistors MCT_1 may store single-bit data (i.e., one-bit data) in single-level cells.

The lower string selection transistor SST_1, the lower memory cell transistors MCT_1, and the lower ground selection transistor GST_1 may be disposed on the substrate 1. Each of the lower memory cell transistors MCT_1 may include a lower tunnel dielectric layer 21, a floating gate electrode 22, a blocking dielectric layer 23, and a control gate 24 which are sequentially stacked. The floating gate electrode 22 may correspond to a data storage element. In each of the lower string selection transistor SST_1 and the lower ground selection transistor GST_1, the control gate 24 may penetrate the blocking dielectric layer 23 so as to be connected to the floating gate electrode 22. The floating gate electrode 22 may be replaced with another data storage element such as a charge trap layer (e.g., a silicon nitride layer) or a charge storage layer. The lower common source line CSL_1 may be a dopant injection region disposed in the substrate 1.

A width of each of at least the lower word lines WL1_1 to WLm_1 may be smaller than those of gate electrodes included in the peripheral transistors TR1.

Referring to FIGS. 2, 4, and 5, in some embodiments, the second memory part (or the user data area) 30 may have a cell structure of a three-dimensional NAND flash memory device. In more detail, the second memory part 30 includes a semiconductor layer 50 disposed on the fourth lower interlayer insulating layer 18. A plurality of upper blocks may be provided on the semiconductor layer 50. The upper blocks include a plurality of upper memory cell strings CSTR_u.

Active pillars AP protrude from the semiconductor layer 50. The active pillars AP may be formed of an undoped poly-silicon layer or an undoped semiconductor layer. Each of the active pillars AP may have a shell shape, and a first filling insulation layer may fill an inner space of each of the active pillars AP. An upper ground selection line GSL_u, upper word lines WL1_u to WLn_u, and an upper string selection line SSL1_u, SSL2_u, or SSLn_u which are sequentially stacked may be adjacent to a sidewall of the active pillar AP. Intergate insulating layers 54 may be disposed between the upper ground selection line GSL_u, the upper word lines WL1_u to WLn_u, and the upper string selection line SSL1_u, SSL2_u, or SSLn_u to electrically isolate them from each other. End portions of the upper ground selection line GSLu, the upper word lines WL1_u to WLn_u, and the upper string selection line SSL1_u, SSL2_u, or SSLn_u which are sequentially stacked may constitute a stepped structure. Heights/distances of the upper word lines WL1_u to WLn_u from the semiconductor layer 50 are different from each other.

Top ends of the active pillars AP may be electrically connected to upper bit lines BL1_u to BLn_u. The upper bit lines BL1_u to BLn_u may extend in a fourth direction D4 and may be separated from each other. The upper ground selection line GSL_u may be provided in plurality on the semiconductor layer 50, and the plurality of ground selection lines GSL_u may extend in a third direction D3 intersecting the fourth direction D4 and may be separated from each other. A second filling insulation layer may be disposed between the upper ground selection lines GSL_u to separate them from each other. Upper common source lines CSL_u may be disposed in the semiconductor layer 50 under the active pillars AP. The upper common source lines CSL_u may be adjacent respective ones of the active pillars AP. Each upper common source line CSL_u may be a dopant injection region disposed in the semiconductor layer 50. At least some of the first to fourth directions D1 to D4 may be the same as or different from each other. For example, the second and third directions D2 and D3 may be the same direction.

A gate dielectric layer 61 may be disposed between the upper ground selection lines GSL_u and the active pillars AP, between the upper word lines WL1_u to WLn_u and the active pillars AP, and between the upper string selection lines SSL1_u to SSLn_u and the active pillars AP. The gate dielectric layer 61 may include a tunnel dielectric layer, a charge storage layer, and a blocking dielectric layer. The charge storage layer may not exist between the upper ground selection lines GSL_u and the active pillars AP and/or between the upper string selection lines SSL1_u to SSLn_u and the active pillars AP.

The upper cell strings CSTR_u may be disposed between the upper common source line CSL_u and the upper bit lines BL1_u to BLn_u. Each of the upper cell strings CSTR_u may include an upper ground selection transistor GST_u connected to the upper common source line CSL_u, an upper string selection transistor SST_u connected to one of the upper bit lines BL1_u to BLn_u, and a plurality of upper memory cell transistors MCT_u disposed between the upper ground and upper string selection transistors GST_u and SST_u. The upper ground selection transistor GST_u, the upper memory cell transistors MCT_u, and the upper string selection transistor SST_u may be connected in series to each other. Each of the upper memory cell transistors MCT_u may store multi-bit data (i.e., at least two-bit data) in multi-level cells.

The upper ground selection line GSLu, the upper word lines WL1_u to WLn_u, and the upper string selection lines SSL1_u to SSLn_u may be used as gate electrodes of the upper ground selection transistor GST_u, the upper memory cell transistors MCT_u, and the upper string selection transistors SST_u, respectively. The upper ground selection transistor GST_u, the upper memory cell transistors MCT_u, and the upper string selection transistor SST_u may be metal-oxide-semiconductor field effect transistors (MOSFETs) using the active pillars AP as channel regions.

End portions of the upper ground selection lines GSL_u, the upper word lines WL1_u to WLn_u, and the upper string selection lines SSL1_u to SSLn_u may be covered with a first upper interlayer insulating layer 51.

The end portions of the upper ground selection lines GSL_u, the upper word lines WL1_u to WLn_u, and the upper string selection lines SSL1_u to SSLn_u may be connected to first upper contacts 55, respectively, penetrating the first upper interlayer insulating layer 51. First upper interconnections 56 may be disposed on the first upper interlayer insulating layer 51 so as to be connected to the first upper contacts 55. Second upper contacts 53 may penetrate the first upper interlayer insulating layer 51 and the fourth lower interlayer insulating layer 18 to electrically connect the first upper interconnections 56 to some of the lower pads 17, respectively. A second upper interlayer insulating layer 52 may be disposed on the first upper interlayer insulating layer 51 and the first upper interconnections 56. A third upper interlayer insulating layer 57 may be disposed on the second upper interlayer insulating layer 52. The upper bit lines BL1_u to BLn_u may be disposed on the third interlayer insulating layer 57. In addition, second upper interconnections 58 may be disposed on the third upper interlayer insulating layer 57 so as to be electrically connected to the upper bit lines BL1_u to BLn_u. Third upper contacts 59 may penetrate the third, second, and first interlayer insulating layers 57, 52, and 51 and the fourth lower interlayer insulating layer 18 to electrically connect the second upper interconnections 58 to others of the lower pads 17.

The upper string selection lines SSL1_u to SSLn_u, the upper ground selection lines GSL_u, and the upper word lines WL1_u to WLn_u may be electrically connected to the row decoder included in the peripheral circuit part 10. In addition, the lower string selection lines SSL1_1 to SSLn_1, the lower ground selection line GSL_1, and the lower word lines WL1_1 to WLm_1 may also be electrically connected to the row decoder included in the peripheral circuit part 10. The upper bit lines BL1_u to BLn_u and the lower bit lines BL1_1 to BLm_1 may be electrically connected to the page buffer included in the peripheral circuit part 10.

The total number of the upper memory cell transistors MCT_u may be greater than that of the lower memory cell transistors MCT_1.

Figure 6:
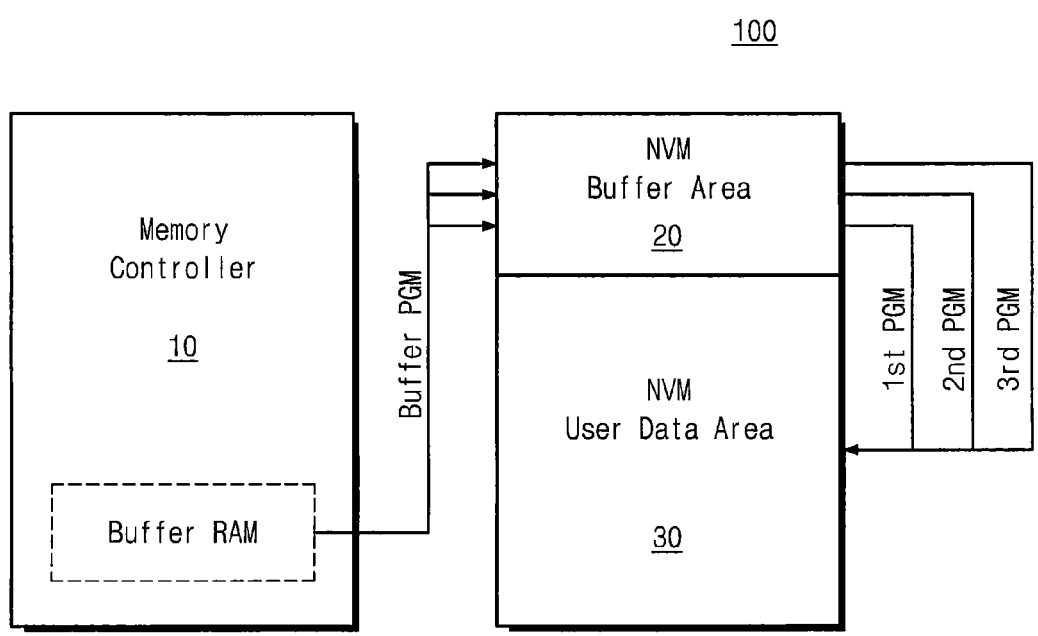
FIG. 6 is a schematic block diagram illustrating a method of programming the semiconductor device illustrated in FIGS. 2 to 5.

FIG. 6 is a schematic block diagram illustrating a method of programming the semiconductor device illustrated in FIGS. 2 to 5.

Referring to FIG. 6, first of all, the peripheral circuit part (i.e., the memory controller) 10 may input program data received from the input/output buffer to the buffer RAM. The memory cells in the first memory part (i.e., the buffer area) 20 may be buffer-programmed using the data input in the buffer RAM. The memory cells in the second memory part (i.e., the user data area) 30 may be programmed using the data buffered in the first memory part (i.e., the buffer area) 20. In other words, during the program operation, data may be written in the first memory part (i.e., the buffer area) 20 and the second memory part (i.e., the user data area) 30 may be then programmed using the data written in the first memory part 20. The programming operation of writing data into the first memory part (i.e., the buffer area) 20 is defined as a "buffer-program operation", and the program operation of writing data into the second memory part (i.e., the user data area) 30 is defined as a "main-program operation". The main-program operation may be performed according to address information related to the data stored in the first memory part (i.e., the buffer area) 20.

For example, a minimum program unit of the first memory part (i.e., the buffer area) 20 and a minimum program unit of the second memory part (i.e., the user data area) 30 may be variously determined depending on a program method and/or the number of data bits stored in one cell. A method of programming the memory blocks included in the buffer area 20 may be different from a method of programming the memory blocks included in the user data area 30. For example, the memory blocks of the buffer area 20 may be programmed by a single-bit program method (or a single-level cell (SLC) program method), and the memory blocks of the user data area 30 may be programmed by a multi-bit program method (or a multi-level cell (MLC) program method). The MLC program method may, in some embodiments, include a triple-level cell (TLC) program method or a quad-level cell (QLC) program method. Thus, each of the lower memory cell transistors MCT_1 included in the buffer area 20 may store one-bit data, and each of the upper memory cell transistors MCT_u may store multi-bit data (i.e., two-or-more-bit data).

The main-program operation may be performed by a reprogram method. In the reprogram method, a plurality of program operations may be performed to reduce a width of a distribution of threshold voltages corresponding to data to be stored. This will be described herein in more detail hereinafter.

Figure 7:
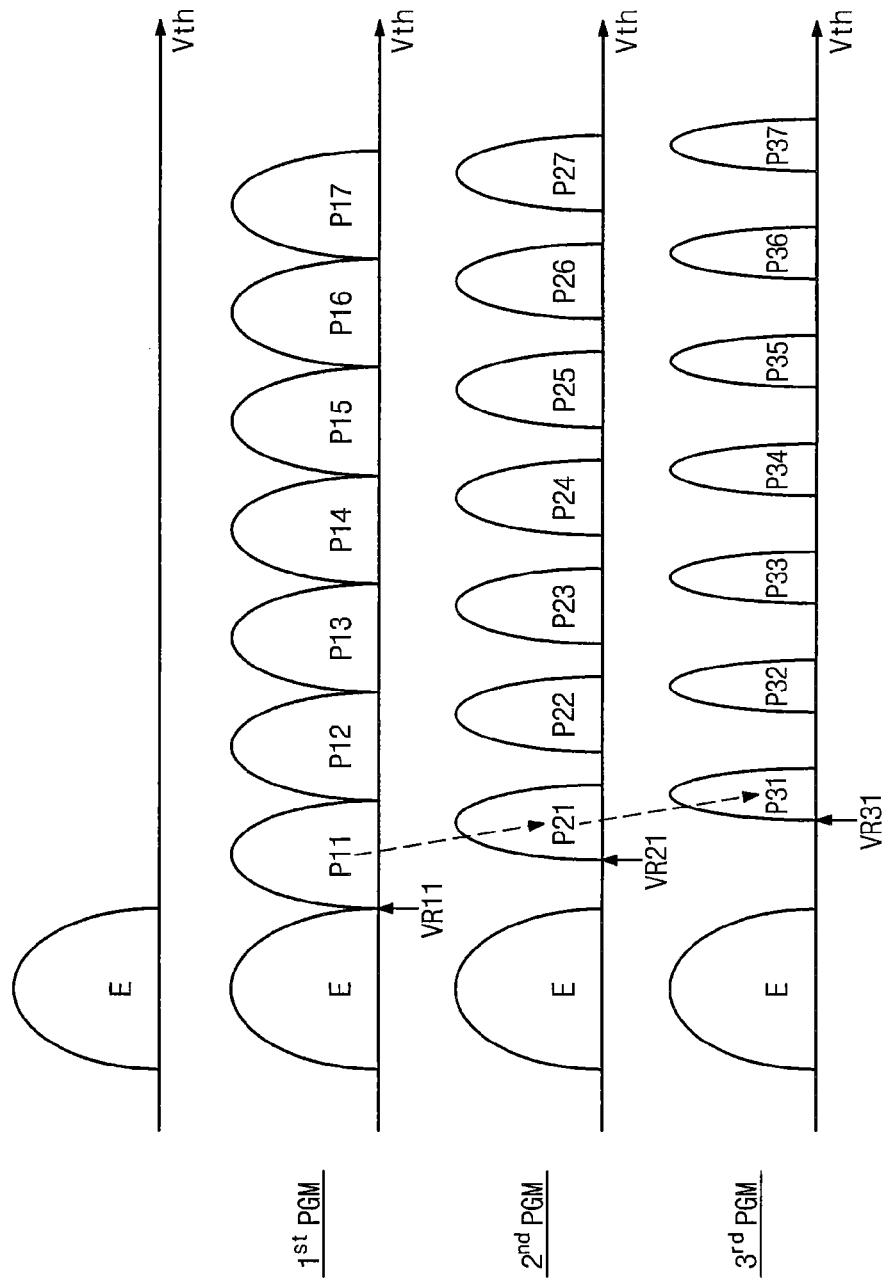
FIG. 7 is a diagram illustrating a threshold voltage distribution according to the method of programming the semiconductor device of FIG. 6.

FIG. 7 is a diagram illustrating a threshold voltage distribution according to the method of programming the semiconductor device of FIG. 6.

Referring to FIGS. 6 and 7, a three-bit program operation may be performed by the reprogram method including three program (PGM) operations 1st PGM, 2nd PGM, and 3rd PGM.

In a first program operation 1st PGM, the memory cell (i.e., the upper memory cell transistor MCT u) of the user data area 30 may be programmed from an erase state E to one, corresponding to three-bit data, of eight states E and P11 to P17. Herein, the eight states E and P11 to P17 may be adjacent to each other without a read margin, as illustrated in FIG. 7. In other words, the three-bit data may be roughly programmed by the first program operation 1st PGM.

In some embodiments, the first program operation 1st PGM may be performed by an incremental step programming pulse (ISPP) method.

In some embodiments, the first program operation 1st PGM may perform at least one verification operation with respect to program states. For example, the first program operation 1st PGM may perform the verification operation with respect to even-numbered program states P12, P14, and P16 but may not perform the verification operation with respect to odd-numbered program states P11, P13, P15, and P17. In other words, if the verification operations of the even-numbered program states P12, P14, and P16 are passed, the first program operation 1st PGM may be completed.

In a second program operation 2nd PGM, the states P11 to P17 programmed by the first program operation 1st PGM may be reprogrammed to be converted into fine states P21 to P27. Here, the states P21 to P27 may be separated from each other to have a predetermined read margin, as illustrated in FIG. 7. In other words, the second program operation 2nd PGM reprograms the three-bit data programmed by the first program operation 1st PGM. For example, the state P11 programmed by the first program operation 1st PGM may be reprogrammed to be converted into the state P21 by the second program operation 2nd PGM, and thus, a threshold voltage distribution corresponding to the state P21 may be narrower than a threshold voltage distribution corresponding to the state P11. In other words, a verification voltage VR21 for verifying the state P21 reprogrammed by the second program operation 2nd PGM may be higher than a verification voltage VR11 for verifying the state P11 programmed by the first program operation 1st PGM.

In some embodiments, the second program operation 2nd PGM may be performed by an ISPP method.

In some embodiments, the second program operation 2nd PGM may perform verification operations with respect to all program states. If the verification operations of all the program states P21 to P27 are passed, the second program operation 2nd PGM may be completed.

In a third program operation 3rd PGM, the states P21 to P27 programmed by the second program operation 2nd PGM may be reprogrammed to be converted into finer states P31 to P37. The states P31 to P37 may be separated from each other to have a predetermined read margin, as illustrated in FIG. 7. Here, the read margin of the states P31 to P37 may be greater than that of the states P21 to P27 formed by the second program operation 2nd PGM. In other words, the third program operation 3rd PGM reprograms the three-bit data programmed by the second program operation 2nd PGM. For example, the state P21 programmed by the second program operation 2nd PGM may be reprogrammed to be converted into the state P31 by the third program operation 3rd PGM, and thus, a threshold voltage distribution corresponding to the state P31 may be narrower than the threshold voltage distribution corresponding to the state P21. In other words, a verification voltage VR31 for verifying the state P31 reprogrammed by the third program operation 3rd PGM may be higher than the verification voltage VR21 for verifying the state P21 programmed by the second program operation 2nd PGM.

In some embodiments, the third program operation 3rd PGM may be performed by an ISPP method.

In some embodiments, the third program operation 3rd PGM may perform verification operations with respect to all program states. If the verification operations of all of the program states P31 to P37 are passed, the third program operation 3rd PGM may be completed. As a result, the three-bit program operation may be finally completed.

In some embodiments, an increase from the verification voltages of the second program operation 2nd PGM to the verification voltages of the third program operation 3rd PGM may be smaller than an increase from the verification voltages of the first program operation 1st PGM to the verification voltages of the second program operation 2nd PGM (e.g., (VR31−VR21)<(VR21−VR11)). In other words, the memory cell of the user data area 30 may be programmed more accurately by the third program operation 3rd PGM than by the second program operation 2nd PGM.

Alternatively, in some embodiments, an increase from the verification voltages of the second program operation 2nd PGM to the verification voltages of the third program operation 3rd PGM may be greater than an increase from the verification voltages of the first program operation 1st PGM to the verification voltages of the second program operation 2nd PGM (e.g., (VR31−VR21)>(VR21−VR11)). In other words, the memory cell of the user data area 30 may, in some embodiments, be programmed more accurately by the second program operation 2nd PGM than by the third program operation 3rd PGM.

The first program operation 1st PGM illustrated in FIG. 7 programs three-bit data. However, present inventive concepts are not limited thereto. In some embodiments, the first program operation 1st PGM may program two-bit data. After the first program operation 1st PGM of the two-bit data is completed, the second program operation 2nd PGM may program three-bit data.

The three-bit program operation illustrated in FIG. 7 includes the three program operations 1st PGM, 2nd PGM, and 3rd PGM. However, present inventive concepts are not limited thereto. In other words, the program operation according to present inventive concepts may be performed by the reprogram method including at least two program operations. A coupling effect between memory cells may be reduced by the reprogram method.

In the semiconductor device according to some embodiments of present inventive concepts, the peripheral circuit part 10 may be disposed under the second memory part 30 used as the user data area, thereby improving an integration degree of the semiconductor device. In addition, the first memory part 20 used as the buffer area may also be disposed under the second memory part 30 and at a side of the peripheral circuit part 10, so that the integration degree of the semiconductor device may be further improved. Furthermore, the second memory part 30 may be reprogrammed using the first memory part 20, thereby reducing the coupling effect between the memory cells included in the second memory part 30. In other words, it may be possible to improve the integration degree and performance of the semiconductor device.

Figure 8:
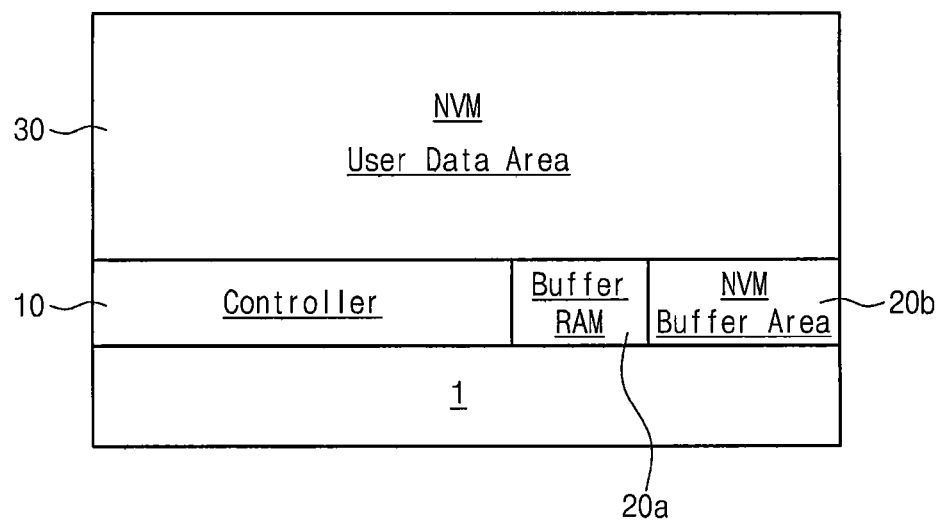
FIG. 8 is a cross-sectional block diagram illustrating an arrangement relation of inner structures of a semiconductor device according to some embodiments of present inventive concepts.

FIG. 8 is a cross-sectional block diagram illustrating an arrangement relation of inner structures of a semiconductor device according to some embodiments of present inventive concepts.

Referring to FIG. 8, in a semiconductor device 101 according to some embodiments, a first memory part may include a buffer RAM 20a and a buffer area 20b. The buffer RAM 20a may have a volatile memory device (e.g., a DRAM or a SRAM) or a volatile memory cell circuit structure (e.g., a memory cell circuit structure of a DRAM or a SRAM). The buffer area 20b may have the two-dimensional (or planar) NAND flash memory structure illustrated in FIG. 3. A programming method of the semiconductor device 101 of FIG. 8 may be the same as or similar to the programming method described with reference to FIGS. 6 and 7.

Figure 9:
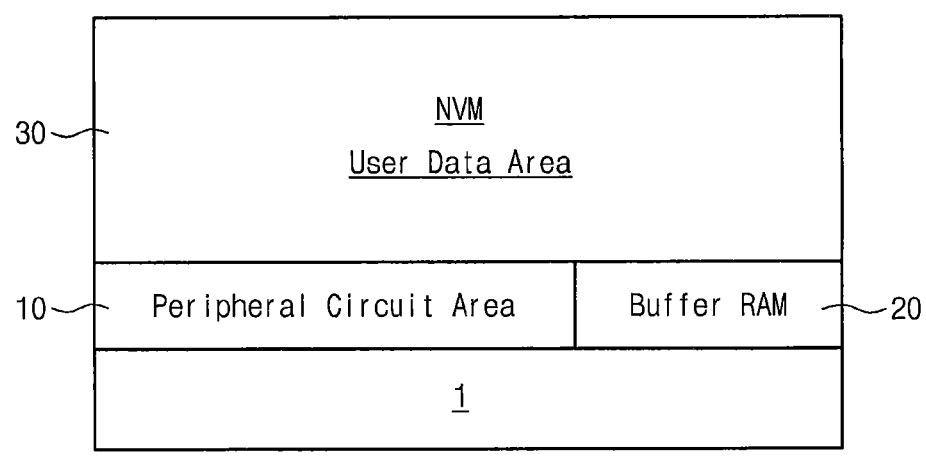
FIG. 9 is a cross-sectional block diagram illustrating an arrangement relation of inner structures of a semiconductor device according to some embodiments of present inventive concepts.
Figure 10:
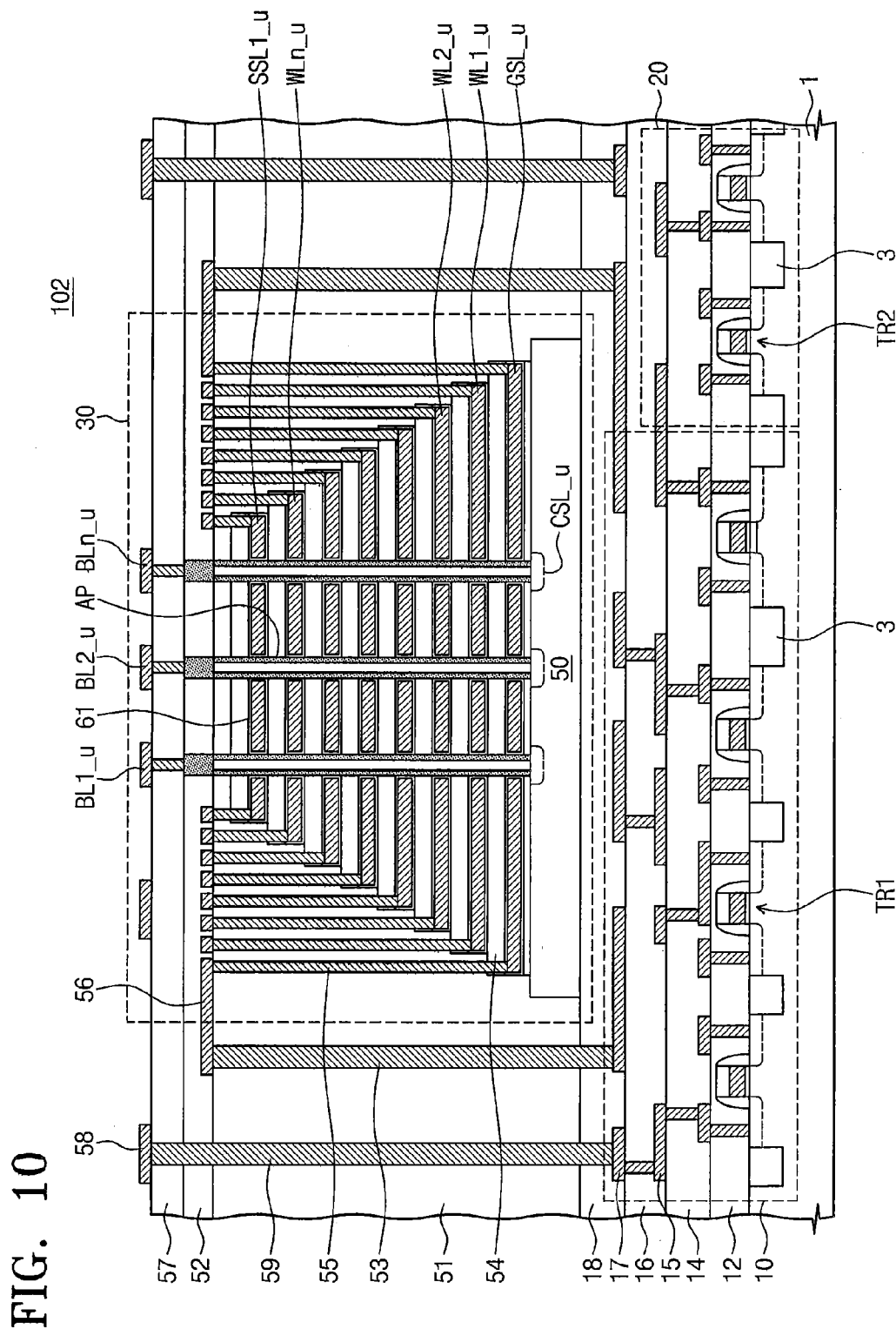
FIG. 10 is a cross-sectional view illustrating the semiconductor device of FIG. 9 according to some embodiments of present inventive concepts.

FIG. 9 is a cross-sectional block diagram illustrating an arrangement relation of inner structures of a semiconductor device according to some embodiments of present inventive concepts. FIG. 10 is a cross-sectional view illustrating the semiconductor device of FIG. 9 according to some embodiments of present inventive concepts.

Referring to FIGS. 9 and 10, a first memory part 20 may be a buffer RAM in a semiconductor device 102 according to some embodiments. The first memory part (i.e., the buffer RAM) 20 may have a volatile memory device (e.g., a DRAM or a SRAM) or a volatile memory cell circuit structure (e.g., a memory cell circuit structure of a DRAM or a SRAM). In this case, a lower cell transistor TR2 included in the first memory part 20 does not include a floating gate electrode, a charge storage layer, and a charge trap layer. If the buffer RAM 20 has the cell structure of a DRAM, the buffer RAM 20 may include a capacitor electrically connected to a source region of the lower cell transistor TR2. Alternatively, the first memory part (i.e., the buffer RAM) 20 may have a structure of a non-volatile memory device such as a phase change random access memory (PRAM), a ferroelectric random access memory (FRAM), a magnetic random access memory (MRAM), or a resistive random access memory (RRAM). In some embodiments, the first memory part (i.e., the buffer RAM)

20 may have a structure of a NOR type flash memory device. Other elements of the semiconductor device 102 may be the same as or similar to corresponding elements of the semiconductor device described with reference to FIGS. 4 and 5.

In a method of programming the semiconductor device 102, the peripheral circuit part (i.e. the memory controller) 10 may input program data received from the input/output buffer into the first memory part (i.e., the buffer RAM) 20, and the second memory part (i.e., the user data area) 30 may then be programmed using the data input in the first memory part (i.e., the buffer RAM) 20.

Figure 11:
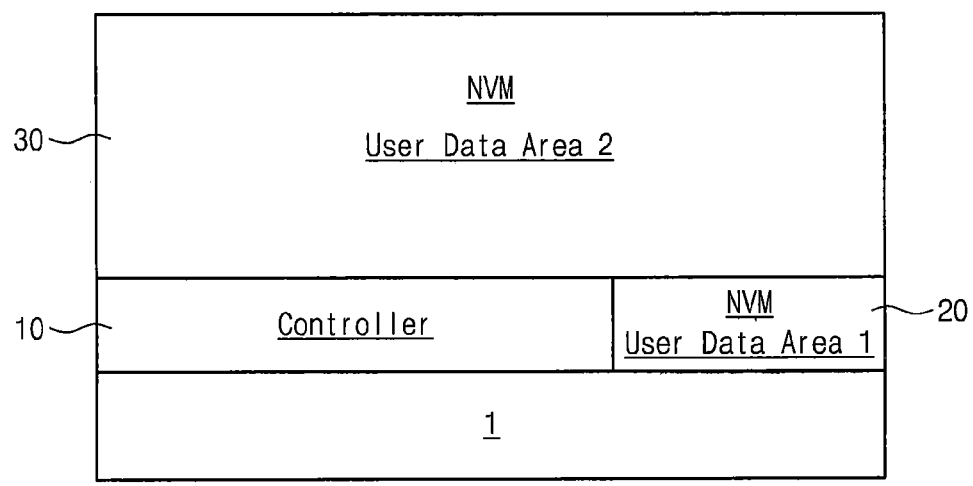
FIG. 11 is a cross-sectional block diagram illustrating an arrangement relation of inner structures of a semiconductor device according to some embodiments of present inventive concepts.

FIG. 11 is a cross-sectional block diagram illustrating an arrangement relation of inner structures of a semiconductor device according to some embodiments of present inventive concepts.

Referring to FIG. 11, a semiconductor device 103 according to some embodiments may include a peripheral circuit part 10, a first memory part 20, and a second memory part 30. The peripheral circuit part 10 may be a memory controller, the first memory part 20 may be a first user data area, and the second memory part 30 may be a second user data area. In other words, the first memory part 20 may also be a portion of a main memory area. That is, the first memory part 20 and the second memory part 3Q may constitute a main memory. A circuit diagram of the first memory part 20 may be the same as illustrated in FIG. 3, and a circuit diagram of the second memory part 30 may be the same as illustrated in FIG. 4. A cross-sectional view of the semiconductor device 103 may be the same as illustrated in FIG. 5. The first memory part 20 may be programmed by a SLC program method, so each of the lower memory cells of the first memory part 20 may store one-bit data. The second memory part 30 may be programmed by a MLC program method, so each of the upper memory cells of the second memory part 30 may store multi-bit data (i.e., two-or-more-bit data).

FIGS. 12 to 15 are plan views illustrating an arrangement relation of inner structures of semiconductor devices according to some embodiments of present inventive concepts.

Figure 12:
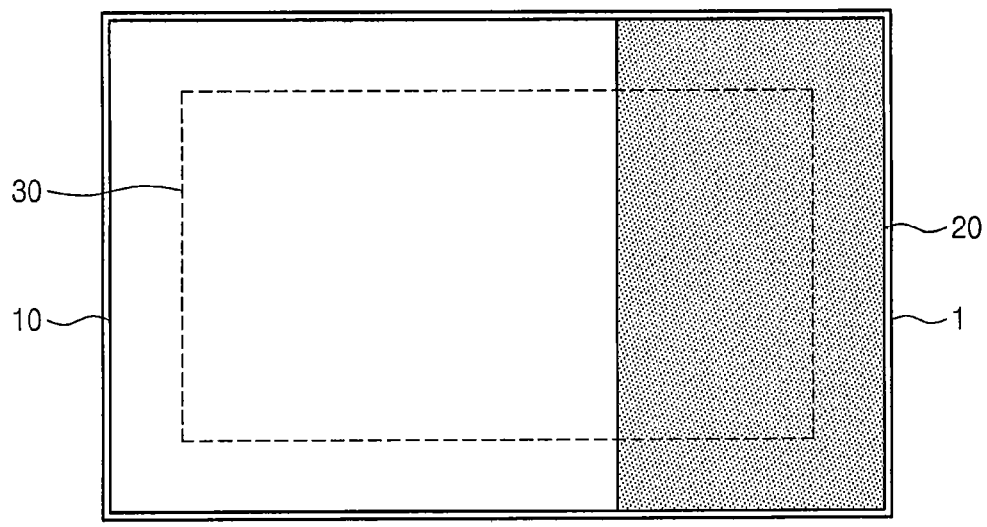
FIGS. 12 to 15 are plan views illustrating an arrangement relation of inner structures of semiconductor devices according to some embodiments of present inventive concepts.
Figure 13:
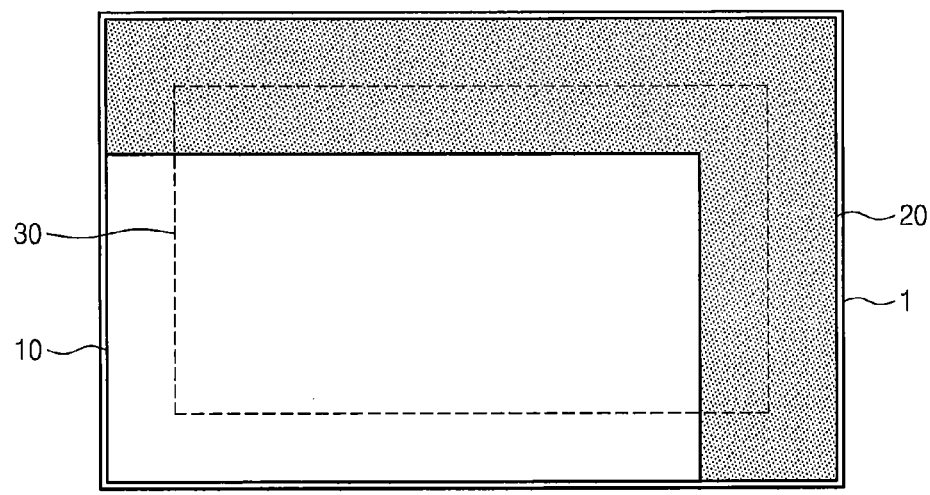
Figure 14:
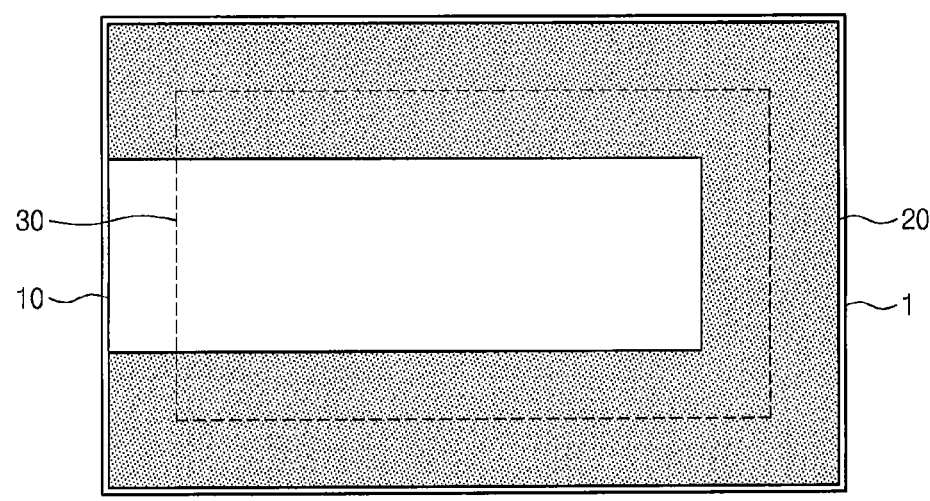
Figure 15:
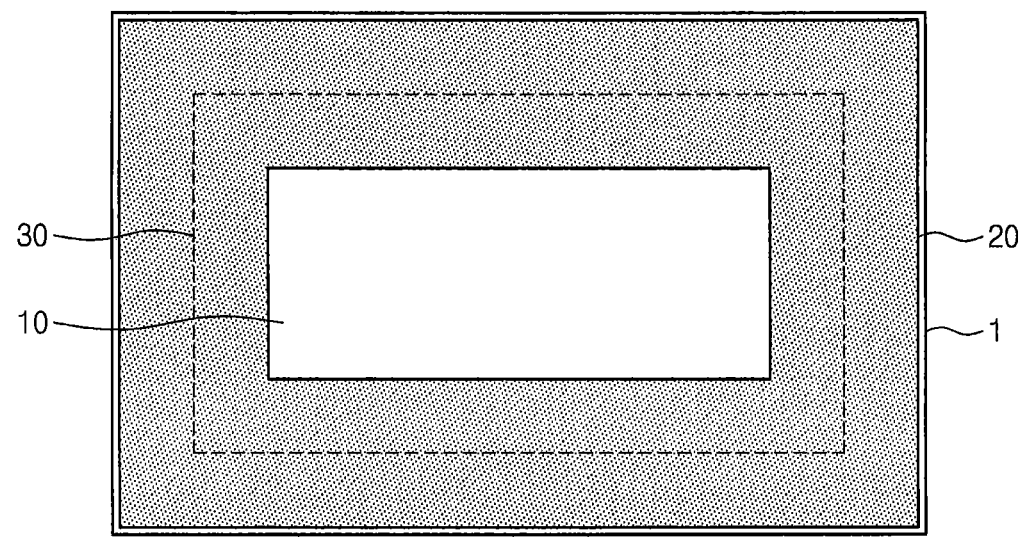

A first memory part 20 may be disposed to be adjacent to only one side of a peripheral circuit part 10, as illustrated in FIG. 12. Alternatively, a first memory part 20 may be disposed to be adjacent to two sides of a peripheral circuit part 10, as illustrated in FIG. 13. In some embodiments, a first memory part 20 may be disposed to be adjacent to three sides of a peripheral circuit part 10, as illustrated in FIG. 14. In some embodiments, a first memory part 20 may be disposed to surround four sides of a peripheral circuit part 10, as illustrated in FIG. 15. In some embodiments, the first memory part 20 may be in contact with one or more sides of the peripheral circuit part 10.

Figure 16:
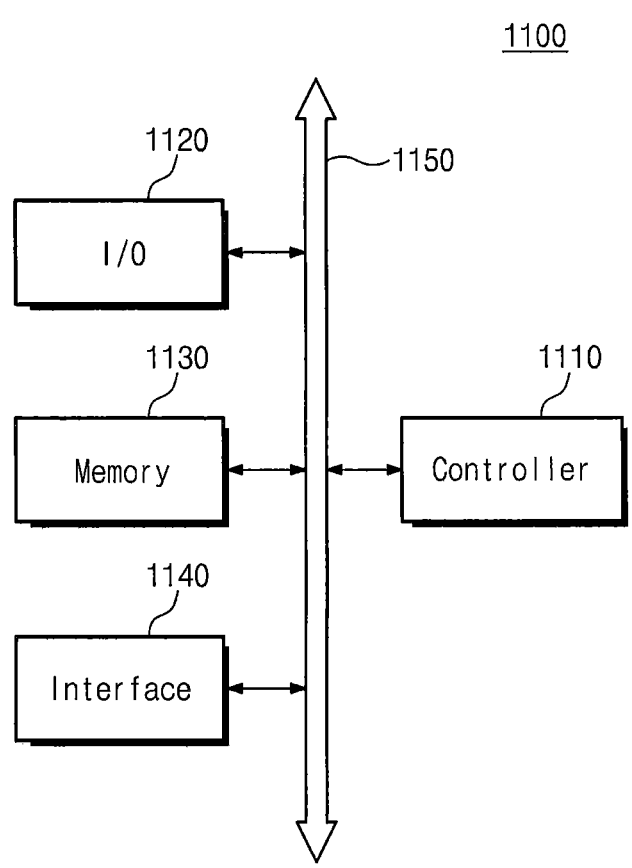
FIG. 16 is a schematic block diagram illustrating an example of a memory system including a semiconductor device according to some embodiments of present inventive concepts.

FIG. 16 is a schematic block diagram illustrating one example of a memory system including a semiconductor device according to some embodiments of present inventive concepts.

Referring to FIG. 16, a memory system 1100 may be used in a personal digital assistant (PDA), a portable computer, a web tablet, a wireless phone, a mobile phone, a digital music player, a memory card, or other electronic products receiving or transmitting information data wirelessly.

The memory system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150.

The controller 1110 may include at least one of a microprocessor, a digital signal processor, a microcontroller, or other logic devices. Functions of the other logic devices may be similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include at least one of the non volatile memory devices according to aforementioned embodiments of present inventive concepts. The memory device 1130 may further include at least one of another type of semiconductor memory devices and volatile random access memory devices.

The interface unit 1140 may transmit electrical data to a communication network and/or may receive electrical data from a communication network.

Figure 17:
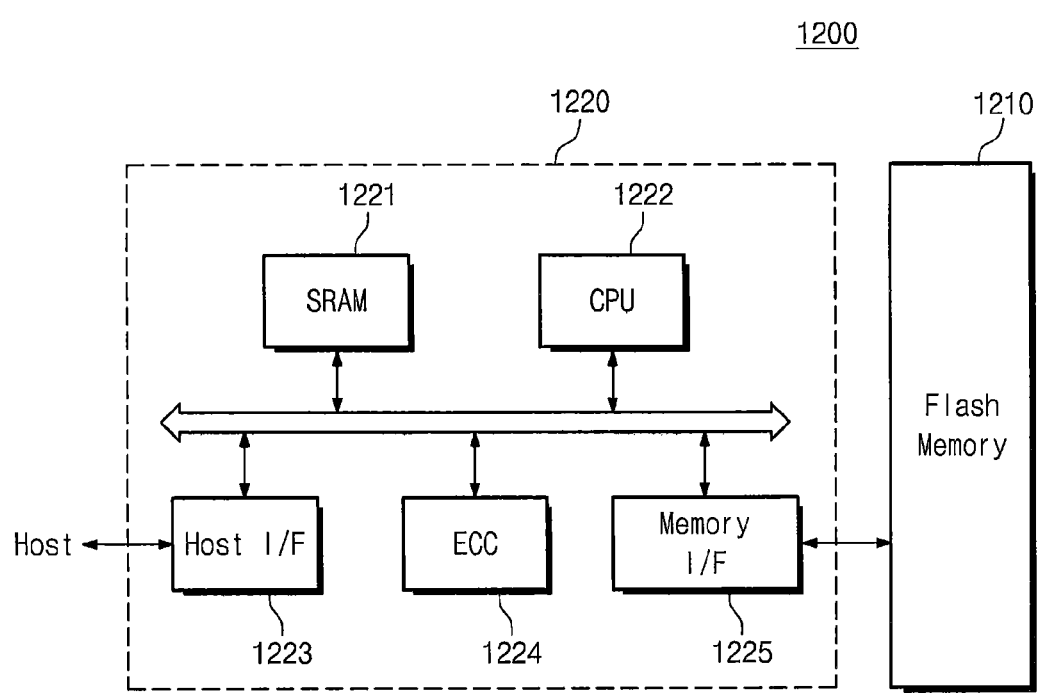
FIG. 17 is a schematic block diagram illustrating an example of a memory card including a semiconductor device according to some embodiments of present inventive concepts.

FIG. 17 is a schematic block diagram illustrating one example of a memory card including a semiconductor device according to some embodiments of present inventive concepts.

Referring to FIG. 17, a memory card 1200 for storing high-capacity data may include a flash memory device 1210 implemented with at least one of the semiconductor devices according to some embodiments of present inventive concepts. The memory card 1200 may further include a memory controller 1220 that controls data communication between a host and the flash memory device 1210.

A SRAM device 1221 may be used as a working memory of a central processing unit (CPU) 1222. A host interface (I/F) unit 1223 may be configured to provide a data communication protocol between the memory card 1200 and the host. An error check and correction (ECC) block 1224 may detect and correct errors of data which are read out from the flash memory device 1210. A memory interface unit 1225 may interface with the flash memory device 1210. The CPU 1222 may control overall operations of the memory controller 1220 for exchanging data. The memory card 1200 may further include a read only memory (ROM) storing code data for interfacing with the host.

The semiconductor devices and/or the memory system according to some embodiments of present inventive concepts may be encapsulated using various packaging techniques. For example, the semiconductor devices and/or the memory system according to aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to some embodiments of present inventive concepts, the peripheral circuit part may be disposed under the second memory part used as the user data area, thereby improving the integration degree of the semiconductor device. In addition, the first memory part used as the buffer memory area may also be disposed under the second memory part. Thus, the integration degree of the semiconductor memory device may be further improved. Moreover, in the method of programming the semiconductor device, the second memory part may be reprogrammed using the first memory part to reduce the coupling effect between the memory cells of the second memory part. In other words, it may be possible to improve the integration degree and the performance of the semiconductor device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a peripheral circuit part and a first memory part side by side on a substrate; and
    a second memory part on the peripheral circuit part and the first memory part,
    wherein the second memory part comprises:
        a semiconductor layer on the peripheral circuit part and the first memory part;
        active pillars protruding from the semiconductor layer;
        word lines adjacent sidewalls of the active pillars; and
        bit lines on the active pillars, and
    wherein the peripheral circuit part extends under the active pillars so that the peripheral circuit part is between the active pillars and the substrate and so that the active pillars overlap the peripheral circuit part,
    wherein the first memory part comprises: first word lines that are parallel to each other and are equidistant from a surface of the substrate, each of the first word lines connected to respective first memory cells,
    wherein the second memory part comprises: second word lines, comprising the word lines that are adjacent the sidewalls of the active pillars, that are parallel to each other and are at different respective distances from the surface of the substrate, and
    wherein the first memory part further comprises a bit line that extends under the semiconductor layer of the second memory part so that the semiconductor layer of the second memory part overlaps a portion of the bit line of the first memory part.

2. The semiconductor device of claim 1, wherein the first memory part comprises:
    a gate electrode on the substrate; and
    a tunnel dielectric layer, a data storage element, and a blocking dielectric layer sequentially stacked between the substrate and the gate electrode.

3. The semiconductor device of claim 1, wherein the first memory part is configured to be used as a buffer memory.

4. The semiconductor device of claim 1, wherein the first memory part comprises a memory structure of at least one of a static random access memory (SRAM), a dynamic random access memory (DRAM), a magnetic random access memory (MRAM), a phase change random access memory (PRAM), a ferroelectric random access memory (FRAM), a resistive random access memory (RRAM), a NOR flash memory, or a NAND flash memory.

5. The semiconductor device of claim 1, wherein the first memory part is adjacent one or more sides of the peripheral circuit part on the substrate.

6. The semiconductor device of claim 1,
    wherein the first memory part comprises a first plurality of memory cells including the respective first memory cells,
    wherein the second memory part comprises a second plurality of memory cells,
    wherein a first quantity of the first plurality of memory cells is smaller than a second quantity of the second plurality of memory cells,
    wherein each of the first plurality of memory cells is configured to store one-bit data, and
    wherein each of the second plurality of memory cells is configured to provide eight states.

7. The semiconductor device of claim 1,
    wherein the peripheral circuit part comprises a peripheral gate electrode,
    wherein the first memory part comprises a cell gate electrode, and
    wherein a first width of the peripheral gate electrode is wider than a second width of the cell gate electrode.

8. The semiconductor device of claim 1, wherein the first memory part and the second memory part constitute a main memory.

9. The semiconductor device of claim 1,
    wherein the first memory part comprises a volatile memory structure, and
    wherein the second memory part comprises a non-volatile memory structure.

10. The semiconductor device of claim 1,
    wherein at least one of the word lines comprises a first portion overlapping the peripheral circuit part and a second portion overlapping the first memory part, and
    wherein the first portion is longer than the second portion.

* * * * *